Figure 1:
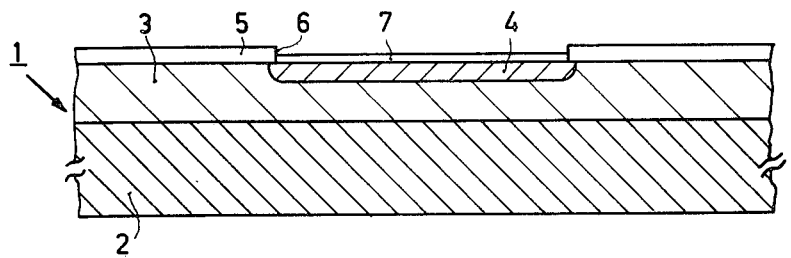

United States Patent [19]

De Graaff et al.

[11] 4,151,006

[45] Apr. 24, 1979

[54] METHOD OF MANUFACTURING A SEMICONDUCTOR DEVICE

[75] Inventors: Hendrik C. De Graaff; Paul A. H. Hart; Albert Schmitz; Jan W. Slotboom, all of Eindhoven, Netherlands

[73] Assignee: U.S. Philips Corporation, New York, N.Y.

[21] Appl. No.: 788,732

[22] Filed: Apr. 19, 1977

[30] Foreign Application Priority Data

Apr. 27, 1976 [NL] Netherlands .................... 7604445

[51] Int. Cl.$^2$ .................... H01L 29/72; H01L 21/265
[52] U.S. Cl. ........................ 148/1.5; 357/34; 357/91
[58] Field of Search ............... 357/91, 34; 148/1.5; 427/94, 95; 156/643

[56] References Cited

U.S. PATENT DOCUMENTS

| | | | |
|---|---|---|---|
| 3,536,547 | 10/1970 | Schmidt | 156/17 |
| 3,775,191 | 11/1973 | McQuhae | 148/1.5 |
| 4,007,474 | 2/1977 | Yagi et al. | 357/34 |
| 4,027,324 | 5/1977 | Yagi et al. | 357/34 |
| 4,028,155 | 6/1977 | Jacob | 156/643 |
| 4,032,956 | 6/1977 | Yagi et al. | 357/37 |
| 4,032,957 | 6/1977 | Yagi et al. | 357/37 |
| 4,063,967 | 12/1977 | Graul et al. | 148/1.5 |

OTHER PUBLICATIONS

Aggarwal, "Emitter . . . Impurity Conc. . . . ", IBM-TDB, 19 (1976) 162.
P. J. Krick, "MNOS . . . Structure, Wilh . . . Ion-Implantation", IBM Tech. Disc. Bull., 17, (1974) 1809.
J. L. Combasson et al., "Phys. Profile . . . Insulating Layers . . . Ion Analyser, "Ed. B. Crowder", Ion-Implantation In Semiconductors . . . ", Plenum Press, p. 285, 1972.

*Primary Examiner*—L. Dewayne Rutledge
*Assistant Examiner*—Upendra Roy
*Attorney, Agent, or Firm*—Thomas A. Briody; Steven R. Biren

[57] ABSTRACT

A method of manufacturing a semiconductor device having a transistor structure in which the emitter zone comprises a lower-doped region adjoining the base zone and a more highly-doped region adjoining the surface. According to the invention, the more highly-doped part is obtained by the introduction of doping atoms through an undoped polycrystalline layer provided on the surface. Preferably, a thin silicon nitride or silicon oxide layer is provided between the surface and the polycrystalline silicon layer prior to providing the latter.

13 Claims, 8 Drawing Figures

METHOD OF MANUFACTURING A SEMICONDUCTOR DEVICE

The invention relates to a method of manufacturing a semiconductor device having a transistor, in which method a semiconductor body has a first region of a first conductivity type on which a second region of the second conductivity type is provided, on which second region a third region of the first conductivity type is provided, after which a surface-adjoining fourth region of the first conductivity type which has a higher doping than the third region is provided in the third region, the first region forming the collector zone, the second region forming the base zone and the third and fourth regions forming the emitter zone of a bipolar transistor.

The invention also relates to a semiconductor device manufactured by using the method.

A method of manufacturing a semiconductor device having a transistor as described above is disclosed in U.S. Patent No. 3,591,430. The transistor described in said Specification comprises an emitter zone which consists of a comparatively low doped part which adjoins the emitter-base junction, and a comparatively highly doped part which adjoins the surface and forms a PP+ or an NN+ junction with the lower doped part.

It has been found that such a transistor can show very good properties, in particular low noise, and also a high current amplification. Furthermore, when the collector zone comprises a lower-doped part adjoining the collector-base junction and a more highly doped part adjoining said lower-doped part, such transistor structures may show a rather symmetrical (N+NPNN+ or P+PNPP+) structure of which the symmetry properties can advantageously be used in many circuit arrangements. The transistors described may be used either as a discrete transistor or may be used in an integrated circuit, in which latter case the collector zone can be formed entirely or partly by a buried layer of the first conductivity type. Therefore the semiconductor device according to the invention may consist of an integrated circuit having a transistor as described above.

The highly doped surface-adjoining part of the emitter zone, hereinbefore referred to as the "fourth region", can be manufactured in different manners, for example, by diffusion from the gaseous phase or by ion implantation, the resulting surface doping being sufficiently high, for example, in an N+N emitter $10^{19}$ to $10^{21}$ atoms per cm$^3$.

One of the objects of the invention is to provide a method of manufacturing such a transistor having considerably improved electrical properties, in particular having a considerably better current amplification, by which is to be understood a higher and/or a less current-dependent current amplification.

The invention is inter alia based on the recognition of the fact that this object can be achieved by providing the highly doped surface layer of the emitter zone according to a very specific method.

It has been found that the way in which the highly doped emitter-surface layer is provided is of very great importance for the properties of the transistor described, which is unexpected since the highly doped emitter surface layer itself does not adjoin the base zone but is separated therefrom by the low-doped part of the emitter zone (the "third region").

According to the invention, in order to form the fourth region, an undoped layer of polycrystalline silicon is provided on the third region after which the fourth region is formed in the third region by the introduction of a dopant through the polycrystalline silicon layer.

It is to be noted that the formation of an emitter zone by diffusion via a polycrystalline silicon layer was known per se for high-frequency transistors, see for example H. Murrmann and A. Glasl "Der Polysil-Emitter" 6th International Congress on Microelectronics, Munich, Nov. 25–27, 1974. However, in contrast with the invention, in this known method the whole emitter zone adjoining the base zone is provided in this manner. As yet it is not apparent why this method results in the said considerable improvements in transistors having an N+N or P+P emitter in which the highly doped emitter region is situated at a distance from the base zone. It has been found, however, that the emitter efficiency of transistors obtained by using the method according to the invention is considerably higher than that of the described known transistor structures in which the highly doped emitter surface layer was manufactured in a different manner.

Furthermore it is of importance to note that the term polycrystalline silicon in this application is used in a broad sense for non-monocrystalline silicon so that a polycrystalline layer is to be understood to mean herein not only a layer consisting of larger or smaller regions which in themselves are monocrystalline but also a layer having an amorphous structure in which no separate regions with in themselves regular atomic arrangement are to be distinguished.

It has furthermore been found that particularly favorable results are obtained when a thin layer of electrically insulating material is provided on the third region prior to providing the layer of polycrystalline silicon. The reason why such a layer yields such a favorable result is still unknown. Advantageously, a layer is provided in a thickness of at least 0.0010 micron (10 Å) and at most 0.0100 micron (100 Å), preferably of at least 0.0020 micron (20 Å) and at most 0.0060 micron (60 Å). Silicon nitride and silicon oxide have proved particularly favorable as a material for said layer. In this connection "silicon nitride" is to be understood to mean a layer which contains silicon, nitrogen and in most cases also a certain quantity of oxygen, but of which the content of nitrogen is sufficiently high for being used, if desired, as an anti-oxidation mask. Likewise in this connection "silicon oxide" is to be understood to mean a layer which contain silicon and oxygen in a ratio which does not necessarily correspond to that in $SiO_2$ (silicon dioxide), for example a mixture of $SiO_2$ and $SiO$.

Figure 7:
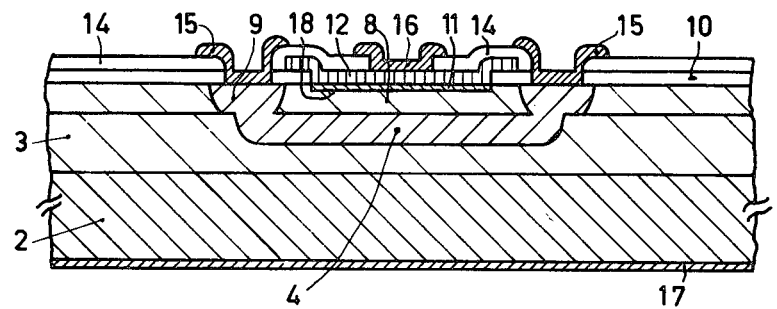
Figure 8:
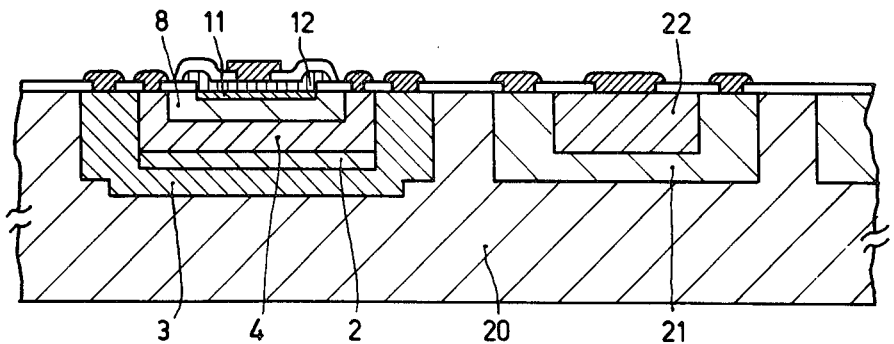

The invention will now be described in greater detail with reference to an embodiment and the drawing, in which FIGS. 1 to 7 are diagrammatic cross-sectional views of successive stages in the manufacture of a semiconductor device according to the invention, and FIG. 8 shows another embodiment of a device manufactured according to the invention.

The figures are diagrammatic and are not drawn to scale. Corresponding components in the figures are referred to by the same reference numerals. Semiconductor zones of the same conductivity type are shaded in the same direction. In so far as process steps to form semiconductor regions and insulating layers on the upper side of the semiconductor body also give rise to the formation of layers on or in the lower side, said layers or zones which are removed afterwards and are of no significance for the invention are not shown in the figures. Although the manufacture of only one device is shown, a large number of such devices which can be separated from each other afterwards are generally manufactured simultaneously in the same semiconductor wafer.

FIGS. 1 to 7 are diagrammatic cross-sectional views of successive stages of the method according to the invention in which the starting material is a semiconductor body 1 having a first region (2, 3) of a first conductivity type. The starting material in this example is a semiconductor body of silicon, while the region (2, 3) is n-type conductive. However, there may also be started from a different semiconductor material, for example germanium or a III–V compound, for example Ga As.

A second region 4 of the second conductivity type, so in this example a p-type conductive region, is provided on said first region 2, 3. The first region (2, 3) is obtained in this case by growing on a substrate 2 of n-type silicon having a resistivity of 0.005 to 0.01 Ohm.cm an epitaxial layer 3 of n-type silicon having a resistivity approximately 0.6 Ohm.cm and a thickness of approximately 10 microns in a manner conventionally used in semiconductor technology. Said layer is then oxidized thermally so that a layer 5 of silicon oxide is formed, approximately 0.5 micron thick. While using known photo-lacquer and etching methods, a window 6 is etched in said layer in dimensions of, for example, $100 \times 100$ microns, after which a very thin oxide layer 7, for example, 0.05 micron thick, is formed in said window by a short thermal oxidation. Boron ions having an energy of, for example, 70 keV and a dose of, for example $10^{13}$ atoms per $cm^2$ are then implanted in the layer 3 through said thin oxide layer 7. By heating, for example first at 900° C. for 30 minutes in dry nitrogen and then at 1200° for 2 hours in an oxidizing atmosphere, the second region 4 is obtained in the form of a p-type layer having a sheet resistance $R_s$ of approximately 10 to 30 kOhm per square. However, the second region 4 may also be formed differently, for example by diffusion from the gaseous phase, from a doped layer, by epitaxial growth or differently. Thus the situation shown in FIG. 1 is obtained.

Figure 2:
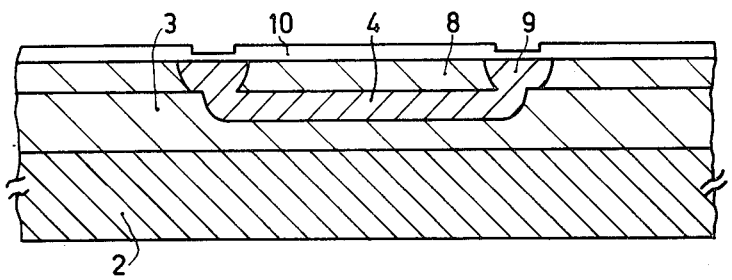

A third region 8 of the first (n) conductivity type is then provided on the second region 4, see FIG. 2. For that purpose the whole silicon surface is etched clean and a layer 8 of n-type silicon having a thickness of approximately 4 microns and a resistivity of approximately 0.6 Ohm.cm is obtained by epitaxial growth according to known methods. The layer 4 has such a low doping that it hardly diffuses in the layer 8. In order to be able to contact the region 4 afterwards, a highly doped p-type annular zone 9 is diffused after the growth of the layer 8 in known manner through the layer 8. An oxide layer 10 is formed.

A surface-adjoining fourth region 11 of the first conductivity type, so in this case an n-type region, is then provided in the third region 8 with a higher doping than the third region 8, the first region (2, 3) forming the collector zone, the second region 4 forming the base zone, and the third region 8 with the fourth region 11 forming the emitter zone of a bipolar transistor, as is shown in FIG. 7 which is a cross-sectional view through the ultimately obtained device.

According to the invention, in order to form said fourth region on the third region 8, an undoped layer 12 of polycrystalline silicon is provided (see FIG. 5) after which the fourth region 11 is formed in the third region through the polycrystalline silicon layer 12 by the introduction of a dopant, in this example a donor. In this example this is done as follows.

First an aperture is etched in the oxide layer at the area of the fourth region 11 to be provided.

Figure 3:
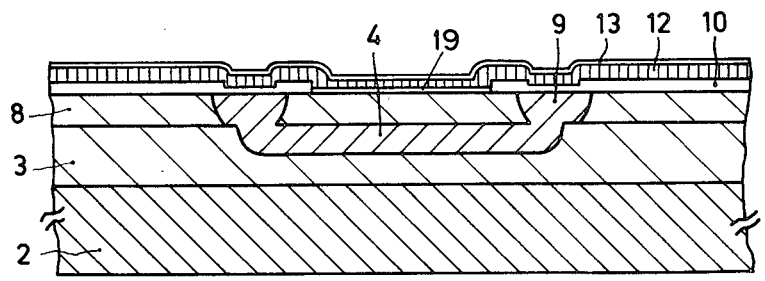

Advantageously, first a very thin insulation layer is provided on the surface of the layer 8 in the aperture (after a HF-dip, for example 30 seconds in a 1% HF-solution). This may be, for example, a silicon nitride layer. This may be provided by heating in an atmosphere containing nitrogen and ammonia in a ratio of 1 volume $NH_3$ on 20 volumes of $N_2$, at a temperature between approximately 900° C. and 1100° C., for example at 1000° C., for 30 minutes. An approximately 0.004 micron (40 Å) thick layer 19 is formed on the layer 8 (see FIG. 3) which contains oxygen in addition to silicon and nitrogen, but of which the content of nitrogen proves to be sufficiently high for it to be used as an anti-oxidation mask. The layer 19 is shown in FIG. 3 but is not shown in FIGS. 4–7 and 8 for reasons of clarity. The silicon nitride layer 19 may also be provided differently, for example in a nitrogen plasma, at a radio frequency, for example with a power of 600 W for 60 minutes at a pressure of 3 Torr, or in an ammonia ($NH_3$) plasma.

Instead of silicon nitride, the layer 19 may be silicon oxide. It may be provided by thermal oxidation at high temperature (700°–800° C.) or by exposure to an oxygen plasma (in which, for example, at will layers of 0.0025 to 0.0060 micron can be obtained with powers varying from 100 to 400 W and times varying from 15 to 30 minutes).

Alternatively, such a layer can be obtained by a treatment in smoking and concentrated boiling nitric acid, respectively.

Figure 4:
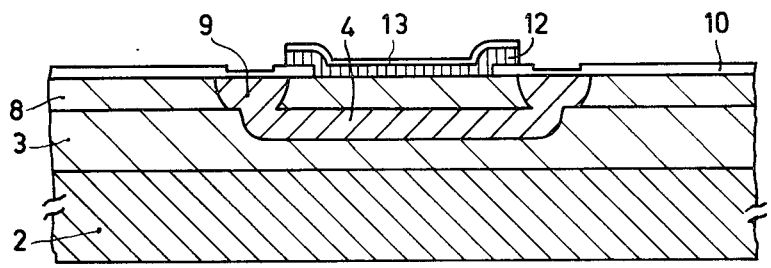
Figure 5:
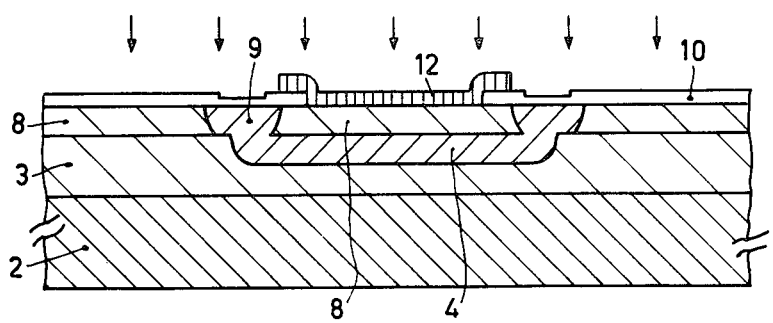
Figure 6:
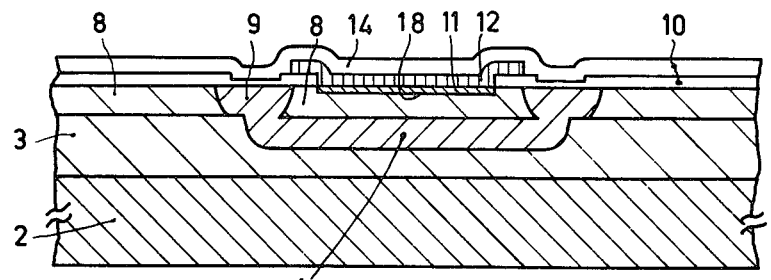

After providing the layer 19 an undoped layer 12 of polycrystalline silicon is provided, for example, by chemical conversion of $SiH_4$ at approximately 650° C. The layer 12 has a thickness of, for example, 0.5 micron. In order to give the layer 12 the desired shape, a very thin surface layer of the layer 12 is converted by thermal oxidation into an oxide layer 13 which is etched into the desired shape by means of a HF-containing solution and then serves as an etching mask for etching the polycrystalline layer 12. Etching of the layer 12 may be done with known etchants, generally a liquid containing $HNO_3$, HF and acetic acid. In this manner the structure shown in FIG. 4 is obtained. After a dip etch, in which no mask is necessary, to remove the thin oxide layer 13 the structure shown in FIG. 5 is obtained.

A donor, in this example phosphorus, is then introduced in the region 8 via the undoped high-ohmic layer of polycrystalline silicon 12. In this example this is done by heating in a $POCl_3$-containing atmosphere at 880° C. for approximately 20 minutes succeeded by an oxidation in moist nitrogen (approximately 20 minutes at 800°). During this treatment the phosphorus diffuses through the polycrystalline silicon layer 12 in the region 8 and forms therein a very shallow highly-doped n-type layer 11 having a thickness which is smaller than 0.1 micron. The polycrystalline silicon layer 12 is further strongly doped with phosphorus during this process, while a phosphor-glass layer 14 is formed over the assembly. Contact windows are then etched in the usual manner in said phosphor-glass layer after which, by vapor-depositing a metal layer, for example an aluminium layer, and etching, a base contact layer 15 is formed on the annular zone 9 and an emitter contact layer 16 is formed on the polycrystalline silicon layer 12. After removing all the glass layers and diffusion layers formed on or in the lower side of the silicon plate during the preceding process steps, a collector contact layer 17 is provided on said lower side.

In this example the fourth region 11 is provided in the semiconductor body down to such a depth that the distance from the junction 18 between the third region 8 and the fourth region 11 down to the second region 4 is at most a diffusion length of minority charge carriers (so in this example holes) in the third region 8. As a result of this a high current gain factor is obtained. Advantages, notably a large current independence of the current gain factor, are achieved by the method according to the invention also when the said distance is larger than a diffusion length, although the current gain factor itself then is smaller.

Transistors manufactured according to the described process have a very good current gain, which appears from the measured emitter-Gummel numbers (GE) which varied from $5.10^{13}$ sec.cm$^{-4}$ to $10^{14}$ sec.cm$^{-4}$. The emitter-Gummel number is to be understood to mean $G_E = h_{FE} \times G_B$, where $h_{FE}$ is the current gain factor and $G_B$ is the base-Gummel number; $G_B$ is defined as $G_B = W_B N_B/D_N$, where $W_B$ = the base width in cm, $N_B$ = the base doping in atoms per cm$^3$, and $D_N$ = the diffusion coefficient for electrons in the (p-type) base in cm$^2$.sec$^{-1}$. For these definitions and the meaning hereof for the behavior of the transistor, reference is invited, for example, to H. C. de Graaf and J. W. Slotboom, Solid State Electronics, Vol. 19, 1976, pp. 809-814.

Since the starting material in this example was a semiconductor body of which the first region was formed by a highly doped substrate on which a lower doped epitaxial layer of the same conductivity type was grown, an N+NPNN+ structure is formed which may show useful symmetry properties. However, the collector region may also be formed differently, for example as a homogeneously doped region without an epitaxial layer. The first region (2, 3) may alternatively consist, for example in integrated circuits, of an "island" 2 having a buried layer 3 surrounded entirely by a p-type conductive region 20. See FIG. 8 in which such an integrated transistor is shown as an example and is provided in a p-type substrate 20 beside a p-n diode (21, 22) provided in another n-type island 21.

In the example of FIGS. 1 to 7, phosphorus atoms were diffused through the polycrystalline layer 12. The introduction of doping atoms through the polycrystalline silicon layer 12, however, may also often be carried out advantageously by ion implantation in the direction of the arrows shown in FIG. 5 in which the glass layer 14 is not formed. Prior to or after such an implantation an insulating layer, for example of silicon oxide, may be formed over the surface, in which layer the contact windows are provided afterwards. In so far as such a layer is provided prior to the implantation, it should, of course, be thin enough to enable implantation of doping ions through said insulating layer and through the polycrystalline layer.

It is to be noted that the introduction of the doping atoms via the polycrystalline silicon layer may alternatively be carried out in two steps, for example, by first diffusing or implanting doping atoms in the undoped polycrystalline layer and then diffusing at least a part of said doping atoms from the polycrystalline silicon layer in the region 8 in a second step by heating. Alternatively, instead of from the gaseous phase, the dopant may be provided in the fourth region from a doped layer, for example, a doped glass layer or another doped layer, through the original undoped polycrystalline silicon layer.

Furthermore, many variations may be applied to the method described. In particular, the conductivity types of all the semiconductor regions in the examples may be changed and other insulating layers, for example of aluminium oxide or silicon nitride, and other semiconductor materials may be used. Different semiconductor materials separated by hetero junctions may also be used. Other doping atoms may also be used, for example instead of phosphorus another donor and instead of boron another acceptor.

The transistor described may alternatively form part of a complicated device, for example a thyristor. For example, the p-type region 20 in FIG. 8 may be contacted so that a pnpn thyristor (20, 3, 2, 4, 8, 11) is formed.

What is claimed is:

1. A method of manufacturing a semiconductor device having a bipolar transistor, the method including the steps of providing a semiconductor body having a first region of a first conductivity type, providing a second region of the second conductivity type on said first region, providing a third region of the first conductivity type on said second region, and then providing in the third region a surface-adjoining fourth region of the first conductivity type having a higher doping than that of the third region, the first region forming the collector zone, the second region forming the base zone, and the third and fourth regions forming the emitter zone of said bipolar transistor, wherein the improvement comprises providing the fourth region by first providing a thin layer of an electrically insulating material on the third region, then forming an undoped layer of polycrystalline silicon on the thin layer and then providing the fourth region in the third region by introducing a dopant through the polycrystalline silicon layer and the thin layer, the thickness of said thin layer being at least about 0.0010 micron and at most about 0.0100 micron.

2. A method as claimed in claim 1, wherein the thin layer is provided in a thickness of at least about 0.0020 micron and at most about 0.0060 micron.

3. A method as claimed in claim 1, wherein the thin layer comprises silicon nitride.

4. A method as claimed in claim 3, wherein the layer of silicon nitride is provided by a heat treatment in an atmosphere containing nitrogen and ammonia.

5. A method as claimed in claim 3, wherein the layer of silicon nitride is provided in a plasma selected from the group consisting of nitrogen plasma and ammonia plasma.

6. A method as claimed in claim 1, wherein the thin layer comprises silicon oxide.

7. A method as claimed in claim 6, wherein the layer of silicon oxide is provided by thermal oxidation.

8. A method as claimed in claim 6, wherein the layer of silicon oxide is provided in an oxygen plasma.

9. A method as claimed in claim 1, wherein the fourth region is provided in the semiconductor body down to such a depth that the distance from the junction between the third and the fourth regions to the second region is at most a diffusion length of minority charge carries in the third region.

10. A method as claimed in claim 1, wherein the third region is formed by epitaxial growth on the second region.

11. A method as claimed in claim 1, wherein the semiconductor body consists entirely of silicon.

12. A method as claimed in claim 1, wherein the regions of the first conductivity type are of n-type conductivity.

13. A method as claimed in claim 1, wherein the first region in the semiconductor body is formed by providing a highly doped substrate of the first conductivity type in said semiconductory body and growing on said substrate an epitaxial layer of a lower doping of the first conductivity type, the second and third regions then being provided on said epitaxial layer.

* * * * *